United States Patent
Liu et al.

(10) Patent No.: US 10,395,085 B2
(45) Date of Patent: Aug. 27, 2019

(54) SEMICONDUCTOR DEVICE AND FINGERPRINT SENSOR DEVICE THEREOF

(71) Applicant: Vanguard International Semiconductor Corporation, Hsinchu (TW)

(72) Inventors: Shih-Hao Liu, Taoyuan (TW); Leuh Fang, Baoshan Township, Hsinchu County (TW); Chih-Cherng Liao, Jhudong Township, Hsinchu County (TW); Yun-Chou Wei, Taipei (TW); Chung-Ren Lao, Taichung (TW); Wu-Hsi Lu, New Taipei (TW)

(73) Assignee: VANGUARD INTERNATIONAL SEMICONDUCTOR CORPORATION, Hsinchu (TW)

(*) Notice: Subject to any disclaimer, the term of this patent is extended or adjusted under 35 U.S.C. 154(b) by 0 days.

(21) Appl. No.: 15/831,813

(22) Filed: Dec. 5, 2017

(65) Prior Publication Data

US 2019/0171857 A1    Jun. 6, 2019

(51) Int. Cl.
| | |
|---|---|
| *H01L 21/768* | (2006.01) |
| *G06K 9/00* | (2006.01) |
| *H01L 23/00* | (2006.01) |
| *H01L 23/522* | (2006.01) |

(52) U.S. Cl.
CPC ...... *G06K 9/0002* (2013.01); *H01L 21/76802* (2013.01); *H01L 21/76834* (2013.01); *H01L 23/5226* (2013.01); *H01L 24/83* (2013.01); *H01L 24/92* (2013.01)

(58) Field of Classification Search
CPC ......... H01L 21/76802; H01L 21/76834; H01L 23/5226
See application file for complete search history.

(56) References Cited

U.S. PATENT DOCUMENTS

| | | | |
|---|---|---|---|
| 5,891,799 A | 4/1999 | Tsui | |
| 6,291,331 B1* | 9/2001 | Wang | H01L 21/76801 257/E21.576 |
| 6,737,748 B2* | 5/2004 | Bauch | H01L 23/5226 257/741 |
| 2002/0086519 A1* | 7/2002 | Houston | H01L 21/76813 438/622 |
| 2014/0021612 A1 | 1/2014 | Huang et al. | |
| 2016/0342823 A1* | 11/2016 | Lee | G06K 9/0002 |

* cited by examiner

*Primary Examiner* — Errol V Fernandes
(74) *Attorney, Agent, or Firm* — Birch, Stewart, Kolasch & Birch, LLP

(57) ABSTRACT

Embodiments of the disclosure relate to a semiconductor device. The semiconductor device includes a semiconductor substrate, a first metal wiring layer disposed on the semiconductor substrate, an interlayer dielectric layer (ILD) disposed on the first metal wiring layer, a second metal wiring layer disposed on the interlayer dielectric layer, and a first via and a second via disposed in the interlayer dielectric layer. The second via is on the first via, and there is not any metal wiring layer in the interlayer dielectric layer.

17 Claims, 6 Drawing Sheets

SEMICONDUCTOR DEVICE AND FINGERPRINT SENSOR DEVICE THEREOF

BACKGROUND

Embodiments of the present disclosure relate to a semiconductor device, and in particular they relate to a semiconductor device which can be used to form a fingerprint sensor device.

Semiconductor devices are used in a variety of electronic applications, such as fingerprint sensor devices, personal computers, cell phones, digital cameras, and other electronic devices. These semiconductor devices are typically fabricated by depositing an insulating layer or dielectric layer, a conductive layer material, and a semiconductor layer material on the semiconductor substrate, followed by patterning the various material layers by using a photolithography process. Therefore, the circuit devices and components are formed on the semiconductor substrate.

Among these devices, a fingerprint sensor device can detect a fingerprint through capacitance difference. Fingerprint sensor devices have attracted attention since their error rates and fabrication costs have steadily decreased as the technology behind them has progressed. However, existing fingerprint sensor devices are not satisfactory in every respect (e.g., their sensitivity is not good enough).

SUMMARY

Some embodiments of the present disclosure relate to a semiconductor device. The semiconductor device includes a semiconductor substrate, a first metal wiring layer disposed on the semiconductor substrate, an interlayer dielectric layer disposed on the first metal wiring layer, a second metal wiring layer disposed on the interlayer dielectric layer, and a first via and a second via disposed in the interlayer dielectric layer. The second via is on the first via, and the interlayer dielectric layer is free of any metal wiring layer.

Some embodiments of the present disclosure relate to a fingerprint sensor device. The fingerprint sensor device includes a semiconductor substrate containing a sensing circuit, a first metal wiring layer disposed on the semiconductor substrate, an interlayer dielectric layer disposed on the first metal wiring layer, a second metal wiring layer disposed on the interlayer dielectric layer, and a first via and a second via disposed in the interlayer dielectric layer. The second via is on the first via, and the interlayer dielectric layer is free of any metal wiring layer. The second metal wiring layer is electrically connected to the sensing circuit through the second via, the first via, and the first metal wiring layer.

BRIEF DESCRIPTION OF THE DRAWINGS

Aspects of the embodiments of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
FIGS. 1-6 are a series of cross-sectional views illustrating a method for forming a semiconductor device according to an embodiment of the present disclosure.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Various embodiments of the present disclosure will be discussed below. Like reference numerals may be used to represent like components. It should be understood that additional steps can be implemented before, during, or after the illustrated methods, and some steps might be replaced or omitted in other embodiments of the illustrated methods.

In a method for forming a semiconductor device of an embodiment of the present disclosure, a first via and a second via disposed on the first via are respectively formed in an interlayer dielectric layer by separate processes. Therefore, the thickness of the interlayer dielectric layer can be increased without increasing the widths of the vias.

FIG. 1 illustrates an initial step of an embodiment of the disclosure. First, a semiconductor substrate 100 is provided. For example, the semiconductor substrate 100 can include silicon. In some embodiments, the semiconductor substrate 100 can include other elementary semiconductor (e.g., germanium), compound semiconductor (e.g., silicon carbide (SiC), gallium arsenic (GaAs), indium arsenide (InAs), or indium phosphide (InP)), and alloy semiconductor (e.g., silicon germanium (SiGe), silicon germanium carbide (SiGeC), gallium arsenic phosphide (GaAsP), or gallium indium phosphide (GaInP)). In other embodiments, the semiconductor substrate 100 can include a semiconductor-on-insulator (SOI) substrate. The SOI substrate can include a bottom substrate, a buried oxide layer disposed on the bottom substrate, and a semiconductor layer disposed on the buried oxide layer.

The semiconductor substrate 100 can include various semiconductor devices. For example, the semiconductor devices can be various active devices, passive devices, other applicable semiconductor devices, or a combination thereof. The active devices can be various types of transistors (e.g., metal-oxide-semiconductor field-effect transistors, complementary metal-oxide-semiconductor transistors, bipolar junction transistors, high voltage transistors, high frequency transistors, or laterally diffused metal oxide semiconductor transistors) or diodes. The passive devices can include resistors or capacitors. Various processes (e.g., deposition, etching, implantation, lithography, annealing, and/or other applicable processes) can be performed to form the semiconductor devices. These processes are not discussed in detail for the interest of simplicity and clarity.

Figure 2:
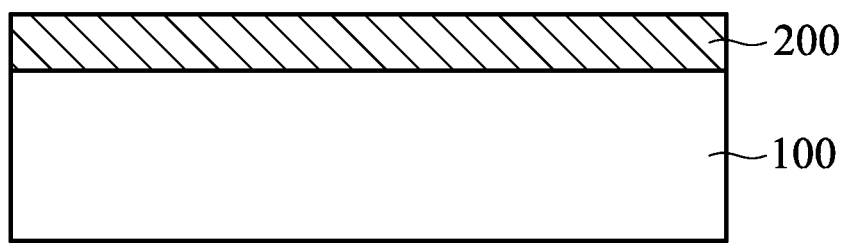

Then, as shown in FIG. 2, a first metal wiring layer 200 is formed on the semiconductor substrate 100. For example, the first metal wiring layer 200 can include Cu, W, Ag, Ag, Sn, Ni, Co, Cr, Ti, Pb, Au, Bi, Sb, Zn, Zr, Mg, In, Te, Ga, other applicable metallic materials, an alloy thereof, or a combination thereof. In some embodiments, the first metal wiring layer 200 can include a stacked structure of TiN/AlCu/TiN. For example, a blanket metal layer (not shown) can be formed on the on the semiconductor substrate 100 by a physical vapor deposition process (e.g., evaporation or sputtering), an atomic layer deposition process (ALD), an electroplating process, other applicable processes or a combination thereof, and then the blanket metal layer is patterned to form the first metal wiring layer 200 by a patterning process. For example, the patterning process can include a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Figure 3:
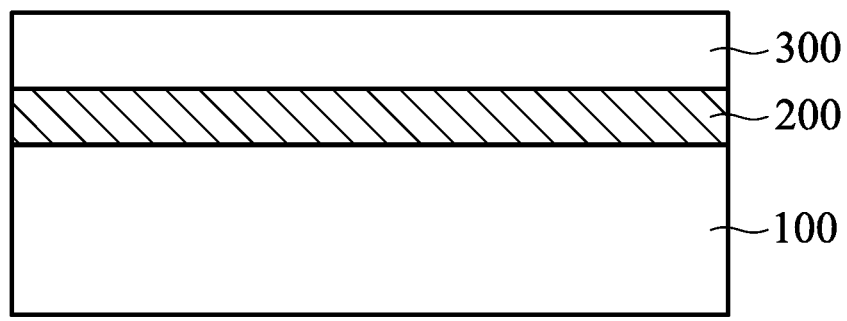

Then, as shown in FIG. 3, a first dielectric layer 300 is formed on the metal wiring layer 200. For example, the first dielectric layer 300 can include silicon oxide, silicon nitride, silicon oxynitride, tetraethoxysilane (TEOS), phosphosilicate glass (PSG), borophosphosilicate glass (BPSG), fluorinated silicate glass (FSG), carbon doped silicon oxide, amorphous fluorinated carbon, parylene, bis-benzocyclobutenes (BCB), polyimide, other applicable dielectric materials, or a combination thereof. In some embodiments, the first dielectric layer 300 can be formed on the metal wiring layer 200 by spin-on coating, chemical vapor deposition (CVD), high-density plasma chemical vapor deposition (HDPCVD), plasma-enhanced chemical vapor deposition (PECVD), other applicable processes, or a combination thereof.

Figure 4:
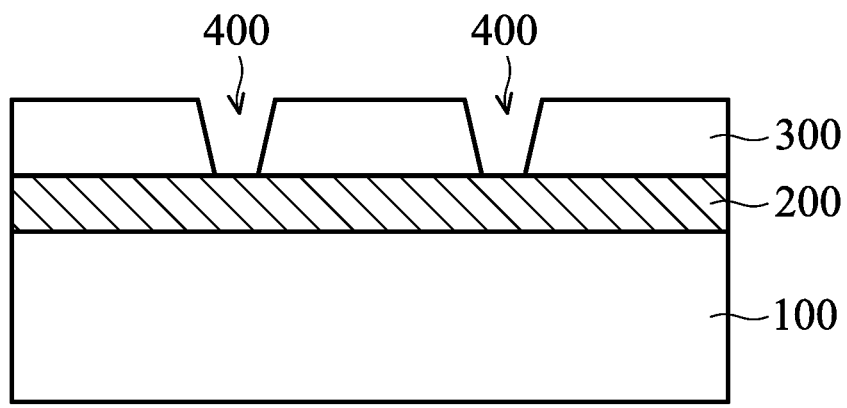

Then, as shown in FIG. 4, one or more openings 400 are formed in the first dielectric layer 300. The openings 400 will be filled with a conductive material to form vias in subsequent processes, and it will be discussed in detail below. In some embodiments, as shown in FIG. 4, the opening 400 has a sidewall which tapers inwardly in a direction towards the semiconductor substrate 100, and thus the via formed in the opening 400 in subsequent processes also has a sidewall which tapers inwardly in a direction towards the semiconductor substrate 100. For example, the openings 400 can be formed in the first dielectric layer 300 by a lithography process (e.g., coating the resist, soft baking, exposure, post-exposure baking, developing, other applicable processes, or a combination thereof), an etching process (e.g., wet etching process, dry etching process, other applicable processes, or a combination thereof), other applicable processes, or a combination thereof.

Figure 5:
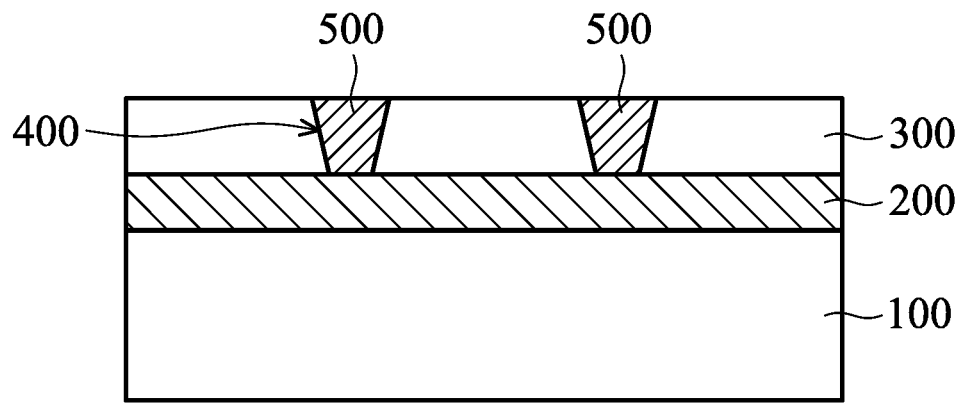

Then, as shown in FIG. 5, the openings 400 are filled with a conductive material to form first vias 500. For example, the conductive material can include metals (e.g., W, Al, or Cu), metal alloys, poly-silicon, other applicable conductive materials, or a combination thereof. In some embodiments, the first vias 500 can be formed by using a physical vapor deposition process (e.g., evaporation or sputtering), an atomic layer deposition process, an electroplating process, other applicable processes or a combination thereof to fill the openings 400 with the conductive material. Furthermore, after depositing the conductive material, a chemical-mechanical polishing process or an etch-back process can be used to remove the excessive conductive material, if needed. In some embodiments, as shown in FIG. 5, since the opening 400 has a sidewall which tapers inwardly in a direction towards the semiconductor substrate 100, the first via 500 also has a sidewall which tapers inwardly in a direction towards the semiconductor substrate 100. In some embodiments, the first via 500 can include a barrier layer or an adhesion layer (not shown), but embodiments of the present disclosure are not limited thereto.

Figure 6:
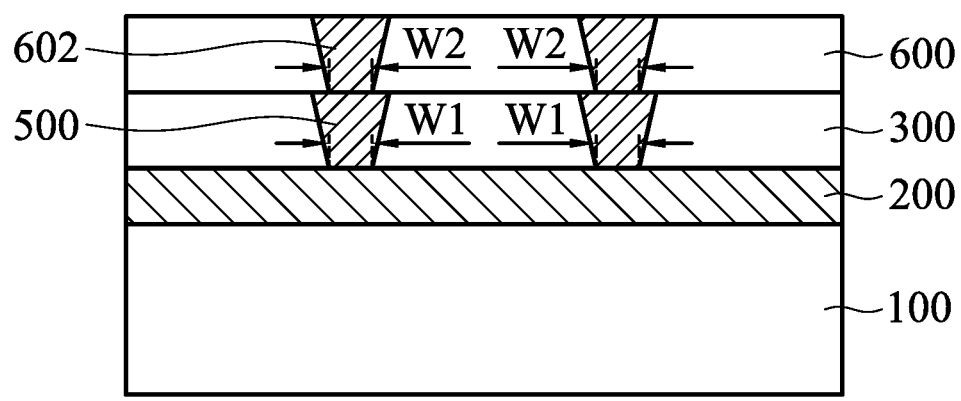

Then, as shown in FIG. 6, a second dielectric layer 600 is formed on the first dielectric layer 300, and one or more second vias 602 are formed in the second dielectric layer 600. Since the materials, structures, and the forming methods of the second dielectric layer 600 and the second via 602 are similar to those of the first dielectric layer 300 and the first via 500, the details will not be repeated. It should be noted that the second vias 602 and the first vias 500 are used to electrically connect the first metal wiring layer 200 to a second metal wiring layer 700 which will be subsequently formed. As shown in FIG. 6, a bottom of the first via 500 can have a first width W1 (e.g., 0.3 µm-0.6 µm), and a bottom of the second via 602 can have a second width W2 (e.g., 0.3 µm-0.6 µm). For example, the first width W1 can be substantially equal to the second width W2 to simplify the processes. In some embodiments, since the sidewall of the first via 500 and the sidewall of the second via 602 both taper inwardly in a direction towards the semiconductor substrate 100, the area of the top surface of the first via 500 may be greater than the area of the bottom surface of the second via 602.

In some embodiments, the second via 602 is in direct contact with the first via 500. For example, the bottom surface of the second via 602 can directly contact the top surface of the first via 500. However, in other embodiments, a metal pad can be formed between the first via 500 and the second via 602, and the detail will be discussed below.

Figure 7A:
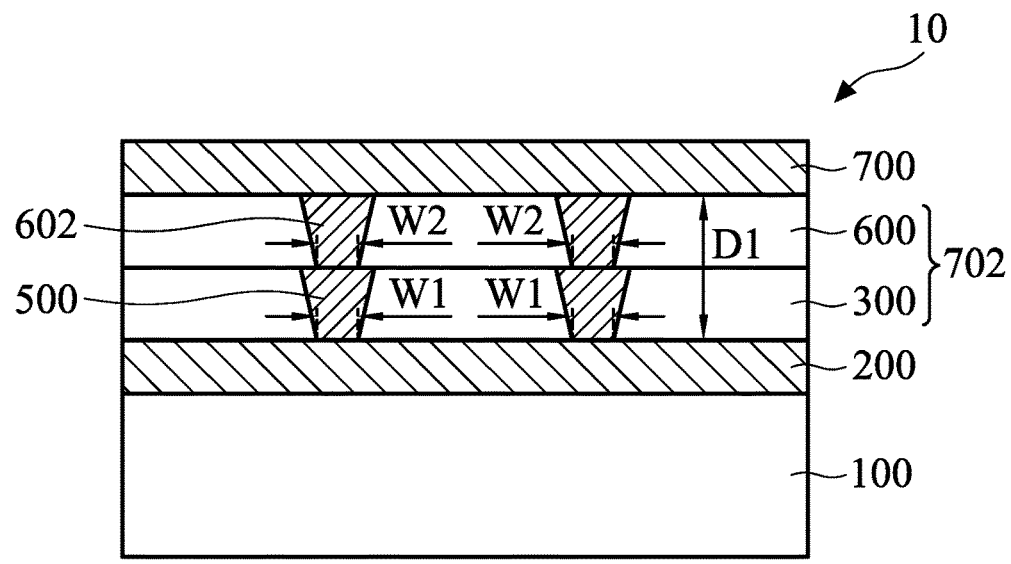
FIG. 7A is a cross-sectional view illustrating a semiconductor device according to an embodiment of the present disclosure.

Then, as shown in FIG. 7A, a second metal wiring layer 700 is formed on the second dielectric layer 600 to form a semiconductor device 10. Since the material, structure, and forming method of the second metal wiring layer 700 are similar to those of the first metal wiring layer 200, the detail will not be repeated. In some embodiments, the second metal wiring layer 700 can be the topmost metal wiring layer of the semiconductor device 10, and can include one or more electrodes.

As shown in FIG. 7A, an interlayer dielectric layer 702 between the first metal wiring layer 200 and the second metal wiring layer 700 is made of the first dielectric layer 300 and the second dielectric layer 600, and there is not any metal wiring layer in the interlayer dielectric layer 702. In some embodiments, there is not any conductive element except via in the interlayer dielectric layer 702.

It should be noted that if a single deposition process is used to form the interlayer dielectric layer with a large thickness, and then the via used to electrically connect the adjacent metal wiring layers is directly formed in the interlayer dielectric layer with a large thickness, the via formed will have a large width due to the limitation of the etching process, and the via with a large width may be disadvantageous to the application of the semiconductor device. By contrast, in the method for forming semiconductor device according to the above embodiments, the first via 500 and the second via 602 in the interlayer dielectric layer 702 are respectively formed by separate processes. Therefore, the thickness of the interlayer dielectric layer 702 can be increased (e.g., D1 can be 3.2 μm-3.8 μm) to reduce the capacitance without increasing the widths of the vias.

It should be understood that although the interlayer dielectric layer includes two dielectric layers (e.g., the first dielectric layer 300 and the second dielectric layer 600) in the above embodiments, the processes for forming the dielectric layers and the vias discussed above can be repeated before forming the second metal wiring layer 700 in other embodiments to form an interlayer dielectric layer including three or more dielectric layers and the vias in the interlayer dielectric layer, if needed.

Figure 7B:
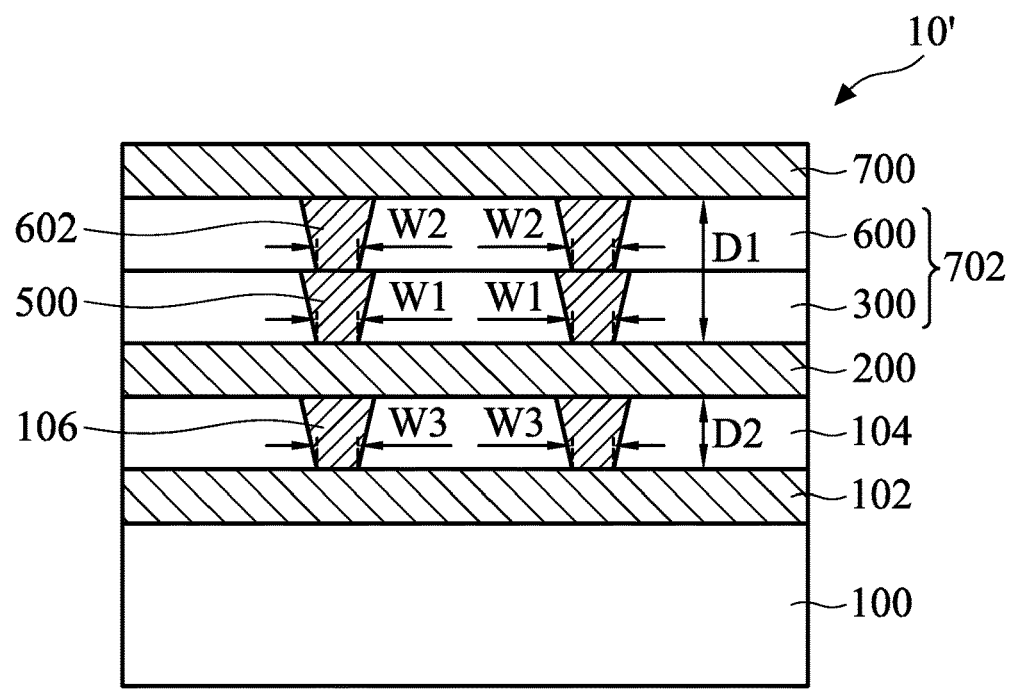
FIG. 7B is a cross-sectional view illustrating a semiconductor device according to an embodiment of the present disclosure.

In addition, one or more other metal wiring layers and interlayer dielectric layers disposed therebetween may be formed between the first wiring layer 200 and the semiconductor layer 100. For example, in the embodiment illustrated in FIG. 7B, the semiconductor device 10' further includes a lower metal wiring layer 102, and a lower interlayer dielectric layer 104 and vias 106 disposed between the lower metal wiring layer 102 and the first metal wiring layer 200. Since the interlayer dielectric layer 702 with a large thickness is formed by the method of the above embodiments of the present disclosure, the thickness D1 of the interlayer dielectric layer 702 of the semiconductor device 10' can be twice to four times the thickness of the lower interlayer dielectric layer 104, and the width (e.g., W1) of the via in the interlayer dielectric layer 702 can remain the same as, or similar to the width (e.g., W3) of the via in the lower interlayer dielectric layer 104. For example, the ratio of W1 to W3 (i.e., W1/W3) may be 1.58 to 1.65.

Figure 7C:
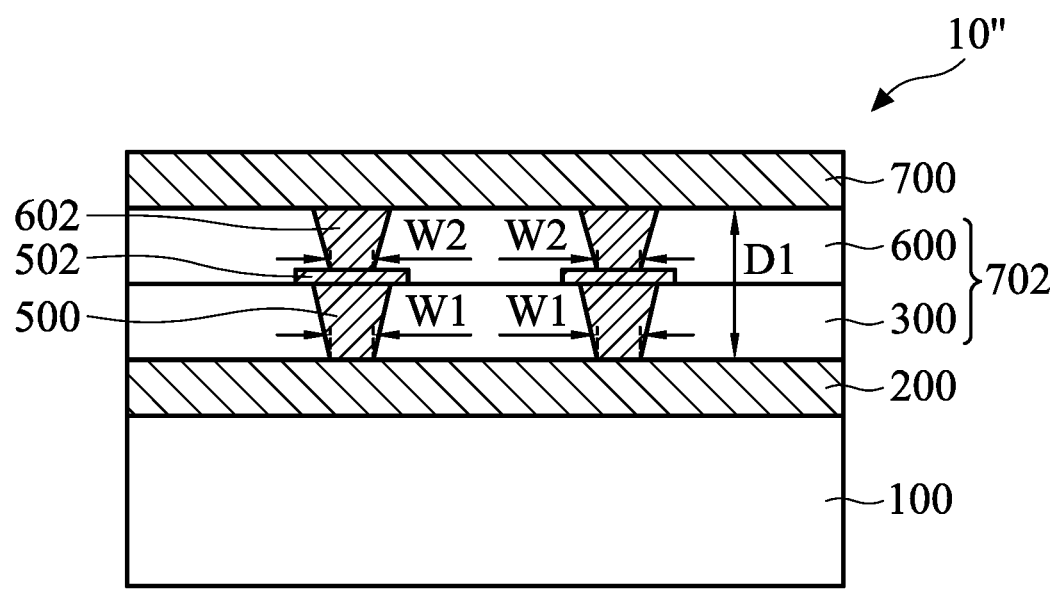
FIG. 7C is a cross-sectional view illustrating a semiconductor device according to an embodiment of the present disclosure.

FIG. 7C illustrates a semiconductor device 10" according to an embodiment of the present disclosure. As shown in FIG. 7C, one or more metal pads 502 are further disposed between the first vias 500 and the second vias 602. For example, the metal pad 502 can include Cu, W, Ag, Ag, Sn, Ni, Co, Cr, Ti, Pb, Au, Bi, Sb, Zn, Zr, Mg, In, Te, Ga, other applicable metallic materials, an alloy thereof, or a combination thereof. In some embodiments, the metal pad 502 can include TiN or AlCu. For example, a blanket metal layer (not shown) can be formed on the first dielectric layer 300 and the first via 500 by a physical vapor deposition process (e.g., evaporation or sputtering), an atomic layer deposition process (ALD), an electroplating process, other applicable processes or a combination thereof, and then the blanket metal layer can be patterned by a patterning process to form the metal pad 502. For example, the patterning process can include a lithography process, an etching process, other applicable processes, or a combination thereof. In some embodiments, the blanket metal layer can be formed by the process of forming the first via 500 to reduce the cost, and thus the first via 500 and the metal pad 502 can include the same material in theses embodiments.

For example, as shown in FIG. 7C, the area of the bottom surface of the metal pad 502 may be greater than the area of the top surface of the first via 500 to protect the first via 500 from damage during the etching process used to form the metal pad 502. For example, as shown in FIG. 7C, the area of the top surface of the metal pad 502 may be greater than the area of the bottom surface of the second via 602 to increase flexibility with respect to the alignment of the second via 602.

The semiconductor devices (e.g., semiconductor devices 10, 10', or 10") of embodiments of the present disclosure can be used to form fingerprint sensor devices, and an example will be discussed below.

Figure 8:
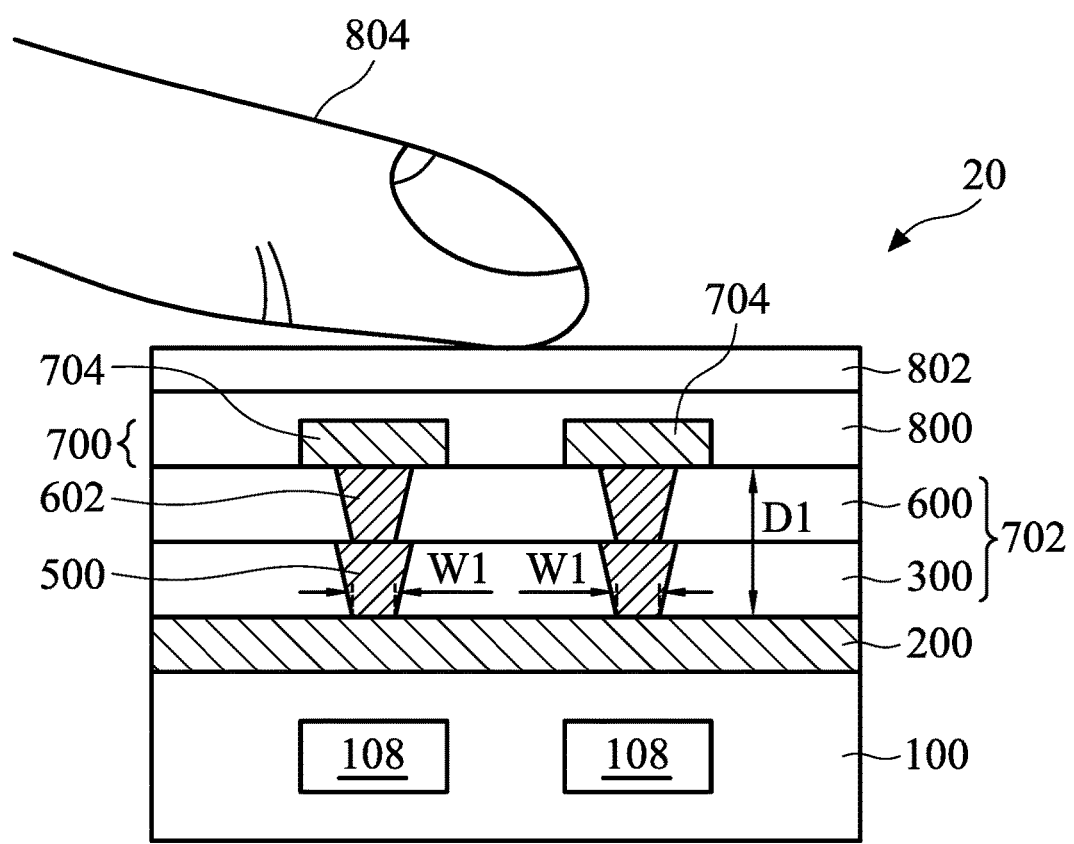
FIG. 8 is a cross-sectional view illustrating a fingerprint sensor device according to an embodiment of the present disclosure.

FIG. 8 illustrates a fingerprint sensor device 20 which includes a semiconductor device according to an embodiment of the present disclosure. As shown in FIG. 8, the semiconductor substrate 100 of the fingerprint sensor device 20 can include one or more sensing circuits 108. The sensing circuit 108 is electrically connected to the second metal wiring layer 700 through the first metal wiring layer 200, the first via 500, and the second via 602. For example, the sensing circuit 108 can include various types of transistors (e.g., metal-oxide-semiconductor field-effect transistors, complementary metal-oxide-semiconductor transistors, bipolar junction transistors, high voltage transistor, high frequency transistors, or laterally diffused metal oxide semiconductor transistors), other applicable semiconductor devices, or a combination thereof. In some embodiments, the second metal wiring layer 700 can be the topmost metal wiring layer (i.e., the metal wiring layer being closest to the finger of the user) of the fingerprint sensor device 20, and can include one or more sensing electrodes 704. For example, a plurality of sensing electrodes 704 can be arranged in an array. For example, a passivation layer 800 and a cover plate 802 (e.g., a glass cover plate) can be disposed on the second metal wiring layer 700 to protect the second metal wiring layer 700 and the underlying layers.

For example, a finger 804 of a user can directly contact/touch the cover plate 802 to serve as an electrode, and different portions of the finger 804 may result in different capacitances with respect to the sensing electrodes 704. The fingerprint sensor device 20 can detect the fingerprint of the user by measuring the capacitance differences between different portions of the finger 804. In some embodiments, since the interlayer dielectric layer 702 has a larger thickness (e.g., D1 is 3.2 μm to 3.8 μm), the capacitance can be reduced to increase the sensitivity of the fingerprint sensor device. Additionally, the method of embodiments of the present disclosure can increase the thickness of the interlayer dielectric layer 702 without increasing the width of the via, thus being advantageous to miniaturizing the device.

In summary, since the first via and the second via disposed on the first via are respectively formed in an interlayer dielectric layer by separate processes in the embodiments of the present disclosure, the thickness of the interlayer dielectric layer can be increased without increasing the widths of the vias. In addition, the semiconductor devices of the embodiments of the present disclosure can be used to form fingerprint sensor devices to obtain better sensitivity.

The foregoing outlines features of several embodiments so that those skilled in the art may better understand the aspects of the present disclosure. Those skilled in the art should appreciate that they may readily use the embodiments of the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the embodiments of the present disclosure, and that they may make various changes, substitutions, and alterations herein without departing from the spirit and scope of the embodiments of the present disclosure.

In addition, although some embodiments of the present disclosure are disclosed above, they are not intended to limit the scope of the present disclosure. Furthermore, not all the advantages of the embodiments of the present disclosure are discussed. In addition, those skilled in the art may make various changes, substitutions, and alterations herein without departing from the spirit and scope of the embodiments of the present disclosure. Therefore, the scope of protection should be determined by the claims.

What is claimed is:

1. A semiconductor device, comprising:
 a semiconductor substrate;
 a first metal wiring layer disposed on the semiconductor substrate;
 an interlayer dielectric layer disposed on the first metal wiring layer;
 a second metal wiring layer disposed on the interlayer dielectric layer; and
 a first via and a second via disposed in the interlayer dielectric layer, wherein the second via is on the first via, and there is no conductive element except the first via and the second via in the interlayer dielectric layer.

2. The semiconductor device of claim 1, wherein a top surface of the first via is in direct contact with a bottom surface of the second via.

3. The semiconductor device of claim 1, further comprising:
 a metal pad disposed between the first via and the second via.

4. The semiconductor device of claim 3, wherein an area of a bottom surface of the metal pad is greater than an area of a top surface of the first via.

5. The semiconductor device of claim 3, wherein an area of a top surface of the metal pad is greater than an area of a bottom surface of the second via.

6. The semiconductor device of claim 1, wherein the second metal wiring layer is a topmost metal wiring layer of the semiconductor device.

7. The semiconductor device of claim 6, wherein the second metal wiring layer comprises an electrode.

8. The semiconductor device of claim 1, wherein a sidewall of the first via tapers inwardly in a direction towards the semiconductor substrate.

9. The semiconductor device of claim 1, wherein an area of a top surface of the first via is greater than an area of a bottom surface of the second via.

10. A fingerprint sensor device, comprising:
 a semiconductor substrate comprising a sensing circuit;
 a first metal wiring layer disposed on the semiconductor substrate;
 an interlayer dielectric layer disposed on the first metal wiring layer;
 a second metal wiring layer disposed on the interlayer dielectric layer; and
 a first via and a second via disposed in the interlayer dielectric layer, wherein the second via is on the first via, and there is no conductive element except the first via and the second via between a top surface and a bottom surface of the interlayer dielectric layer, and wherein the second metal wiring layer is electrically connected to the sensing circuit through the second via, the first via, and the first metal wiring layer.

11. The fingerprint sensor device of claim 10, wherein the sensing circuit comprises a transistor.

12. The fingerprint sensor device of claim 10, wherein the second metal wiring layer comprises a plurality of sensing electrodes.

13. The fingerprint sensor device of claim 10, wherein the second metal wiring layer is a topmost metal wiring layer of the fingerprint sensor device.

14. The fingerprint sensor device of claim 10, wherein a top surface of the first via is in direct contact with a bottom surface of the second via.

15. The fingerprint sensor device of claim 10, further comprising:
 a metal pad disposed between the first via and the second via.

16. The fingerprint sensor device of claim 10, further comprising:
 a cover plate disposed on the second metal wiring layer.

17. The fingerprint sensor device of claim 16, wherein the cover plate comprises glass.

* * * * *